United States Patent
Curtis (10) Patent No.: US 9,543,899 B2
(45) Date of Patent: Jan. 10, 2017

(54) CLASS D POWER DRIVER PERIPHERAL

(71) Applicant: Microchip Technology Incorporated, Chandler, AZ (US)

(72) Inventor: Keith E. Curtis, Gilbert, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 52 days.

(21) Appl. No.: 14/536,916

(22) Filed: Nov. 10, 2014

(65) Prior Publication Data

US 2016/0134239 A1    May 12, 2016

(51) Int. Cl.
| | |
|---|---|
| H03F 1/02 | (2006.01) |
| H03F 3/183 | (2006.01) |
| H03F 3/217 | (2006.01) |
| H03F 3/68 | (2006.01) |

(52) U.S. Cl.
CPC ............ *H03F 1/0205* (2013.01); *H03F 3/183* (2013.01); *H03F 3/2171* (2013.01); *H03F 3/2173* (2013.01); *H03F 3/2175* (2013.01); *H03F 3/68* (2013.01); *H03F 2200/03* (2013.01); *H03F 2200/351* (2013.01)

(58) Field of Classification Search
CPC ...... H03F 1/0205; H03F 3/183; H03F 3/2171; H03F 3/2173; H03F 3/2175; H03F 3/68; H03F 2200/03; H03F 2200/351
USPC .............................. 381/120–121; 330/250–251
See application file for complete search history.

(56) References Cited

U.S. PATENT DOCUMENTS

| | | | |
|---|---|---|---|
| 5,973,368 A | 10/1999 | Pearce et al. ................. 257/368 |
| 2008/0315948 A1 | 12/2008 | Pyykonen et al. ............ 330/251 |
| 2012/0056552 A1* | 3/2012 | Yu ...................... H05B 33/0815 315/245 |
| 2012/0294473 A1* | 11/2012 | Pierce ...................... H04R 9/06 381/396 |
| 2013/0154670 A1* | 6/2013 | Cooke ................... G01N 27/66 324/672 |
| 2013/0216076 A1* | 8/2013 | Knudsen ............... H03F 3/2173 381/312 |
| 2013/0335143 A1* | 12/2013 | Lee .......................... H03K 4/06 330/251 |
| 2015/0155839 A1* | 6/2015 | Buono .................. H03F 3/2173 381/94.1 |

(Continued)

OTHER PUBLICATIONS

Perme, Thomas, "AN1101: Introduction to Capacitive Sensing," Microchip Technology Incorporated, 10 pages, © 2007.

(Continued)

*Primary Examiner* — Disler Paul
(74) *Attorney, Agent, or Firm* — Slayden Grubert Beard PLLC (57) ABSTRACT

A Class D peripheral is integrated with a microcontroller as a general purpose driver for providing many different Class D power applications such as motor and solenoid control, audio amplification, etc. Use of a simple triangle waveform (saw tooth) oscillator normally used for detecting changes in capacitance values in combination with a voltage comparator provides inexpensive generation of pulse width modulation (PWM) suitable for a wide range of Class D power applications. Selection of either an external audio input or an internal processor controlled analog reference provides for flexible adaptability to any Class D power driver requirement.

21 Claims, 8 Drawing Sheets

(56) References Cited

U.S. PATENT DOCUMENTS

2015/0180430 A1* 6/2015 Wang ............... H03F 3/217
381/120

OTHER PUBLICATIONS

Aleman, Enrique, "AN1171: Using the Capacitive Sensing Module on the PIC16F72X," Microchip Technology Incorporated, 8 pages, Jan. 2, 2008.
Perme, Thomas, "AN1268: mTouchTM Capacitive Sensing Using Period Method," Microchip Technology Incorporated, 8 pages, © 2009.
Davison, Burke, "AN1334: Techniques for Robust Touch Sensing Design," Microchip Technology Incorporated, 30 pages, Nov. 29, 2012.
International Search Report and Written Opinion, Application No. PCT/US2015/059657, 11 pages, Feb. 11, 2016.

* cited by examiner

CLASS D POWER DRIVER PERIPHERAL

TECHNICAL FIELD

The present disclosure relates to a Class D power driver peripheral, in particular, a Class D power driver peripheral integrated with a microcontroller integrated circuit.

BACKGROUND

All Class D modulation techniques encode information about an analog voltage, a fixed or time varying analog voltage, e.g., a DC control voltage or an audio signal into a stream of pulses. Generally, the pulse widths are linked to the amplitude of the analog voltage, and the spectrum of the pulses includes the desired analog information. The most common modulation technique is pulse-width modulation (PWM). Conceptually, PWM compares the input analog voltage to a triangular or ramping up and down waveform that runs at a fixed carrier frequency. This creates a stream of pulses at the carrier frequency. Within each period of the carrier frequency, the duty ratio of the PWM pulse is proportional to the amplitude of the analog voltage. PWM is attractive because it allows 100-dB or better audio-band SNR at PWM carrier frequencies of a few hundred kilohertz, low enough to limit switching losses in the output stage. Also many PWM modulators are stable up to nearly 100 percent modulation, in concept permitting high output power up to the point of overloading. Class D power drivers have many uses including but not limited to audio amplification, motor and servo control, and the like.

SUMMARY

Therefore a need exists for an inexpensive and versatile Class D power driver that may easily be adapted in operation with a microcontroller integrated circuit.

According to an embodiment, a class D power driver peripheral may comprise: a voltage comparator having a first input coupled to an analog voltage; a capacitive sensing module (CSM) having an output coupled to a second input of the voltage comparator and in input coupled to an external capacitor, wherein the CSM provides a triangle waveform output to the voltage comparator and the external capacitor determines a frequency of the triangle waveform; and a complementary output generator (COG) having an input coupled to an output of the voltage comparator and a plurality of outputs controlled by the output of the voltage comparator.

According to a further embodiment, the analog voltage may be provided by a digital-to-analog converter (DAC). According to a further embodiment, the analog voltage may be provided by an external audio signal. According to a further embodiment, a differential amplifier having first and second inputs may be adapted for coupling to a load driven by the COG; an operational amplifier having a first input may be coupled to an output of the differential amplifier and a second input may be coupled to the analog voltage, wherein an output of the operational amplifier may be coupled to the first input of the voltage comparator instead of the analog voltage; and a closed loop compensation circuit may be coupled with the operational amplifier.

According to a further embodiment, the voltage comparator, the CSM and the COG may be provided in an integrated circuit microcontroller. According to a further embodiment, the voltage comparator, the CSM, the DAC and the COG may be provided in an integrated circuit microcontroller, and the DAC may be coupled to and controlled by a digital processor of the microcontroller. According to a further embodiment, the voltage comparator, the CSM, the COG, the differential amplifier, the operational amplifier and the closed loop compensation circuit may be provided in an integrated circuit microcontroller.

According to a further embodiment, the CSM may comprise: first and second CSM comparators; an RS-latch, wherein the set input of the RF-latch may be coupled to an output of the first CSM comparator and the reset input may be coupled to the second CSM comparator; and a feedback resistor coupled between a Q-not output of the RS-latch and the external capacitor. According to a further embodiment, the CSM may comprise: a comparator with hysteresis; and first and second current sources coupled to an input of the comparator with hysteresis and the external capacitor, wherein an output of the comparator with hysteresis controls operation of the first and second current sources for charging and discharging the external capacitor.

According to another embodiment, an integrated circuit microcontroller having a class D power driver peripheral may comprise: a digital processor and memory; a digital-to-analog converter (DAC) having inputs coupled to the digital processor; a voltage comparator having a first input coupled to an output of the DAC; a capacitive sensing module (CSM) having an output coupled to a second input of the voltage comparator and in input coupled to an external capacitor, wherein the CSM provides a triangle waveform output to the voltage comparator and the external capacitor determines a frequency of the triangle waveform; and a complementary output generator (COG) having an input coupled to an output of the voltage comparator and a plurality of outputs controlled by the output of the voltage comparator.

According to a further embodiment, a differential amplifier having first and second inputs may be adapted for coupling to a load driven by the COG; an operational amplifier having a first input may be coupled to an output of the differential amplifier and a second input may be coupled to the analog voltage, wherein an output of the operational amplifier may be coupled to the first input of the voltage comparator instead of the analog voltage; and a closed loop compensation circuit may be coupled with the operational amplifier. According to a further embodiment, a switch may be coupled between the output of the DAC and the first input of the voltage comparator, and also may be coupled to an external analog input, wherein the switch may be controlled by the digital processor and may be adapted to couple either the output of the DAC or the external analog input to the first input of the voltage comparator.

According to a further embodiment, the CSM may comprise: first and second CSM comparators; an RS-latch, wherein the set input of the RF-latch may be coupled to an output of the first CSM comparator and the reset input may be coupled to the second CSM comparator; and a feedback resistor coupled between a Q-not output of the RS-latch and the external capacitor. According to a further embodiment, the CSM may comprise: a comparator with hysteresis; and first and second current sources coupled to an input of the comparator with hysteresis and the external capacitor, wherein an output of the comparator with hysteresis controls operation of the first and second current sources for charging and discharging the external capacitor.

According to a further embodiment, a plurality of power metal oxide semiconductor field effect transistors (MOSFETs) each having a gate control may be coupled to a respective one of the COG outputs, wherein the plurality of power MOSFETs may be configured in an H-bridge; and a load coupled to and power by the H-bridge configured power MOSFETs.

According to a further embodiment, the load may comprise an audio speaker. According to a further embodiment, the load may be selected from the group consisting of a motor, a transducer, a solenoid actuator, and a piezo electric actuator. According to a further embodiment, the COG has dead band control to prevent current shoot through of the H-bridge configured power MOSFETs.

According to a further embodiment, a differential amplifier having first and second inputs may be coupled to the load; an operational amplifier having a first input may be coupled to an output of the differential amplifier and a second input may be coupled to the analog voltage, wherein an output of the operational amplifier may be coupled to the first input of the voltage comparator instead of the analog voltage; and a closed loop compensation circuit may be coupled with the operational amplifier.

According to a further embodiment, a plurality of power metal oxide semiconductor field effect transistors (MOSFETs) each having a gate control may be coupled to a respective one of the COG outputs, wherein the plurality of power MOSFETs may be configured in an H-bridge; and a load coupled to and power by the H-bridge configured power MOSFETs.

According to a further embodiment, a differential amplifier having first and second inputs may be coupled to the load; an operational amplifier having a first input may be coupled to an output of the differential amplifier and a second input may be coupled to the analog voltage, wherein an output of the operational amplifier may be coupled to the first input of the voltage comparator instead of the analog voltage; and a closed loop compensation circuit may be coupled with the operational amplifier.

According to still another embodiment, a method for providing a class D power driver peripheral may comprise the steps of: comparing an analog voltage to a triangle waveform with a voltage comparator, wherein the triangle waveform may be provided from a capacitive sensing module (CSM); coupling a pulse width modulation (PWM) waveform resulting from the comparison of the analog voltage and the triangle waveform to a complementary output generator (COG); and generating PWM signals with the COG to control an H-bridge connected plurality of power metal oxide semiconductor field effect transistors (MOSFETs).

According to a further embodiment of the method, may comprise the step of powering a load with the H-bridge connected plurality of power MOSFETs. According to a further embodiment of the method may comprise the steps of: coupling a differential amplifier to the load; coupling an operational amplifier to the differential amplifier and the analog voltage; and coupling the operational amplifier to the CSM, wherein the differential amplifier and operational amplifier may provide feedback from the load for improved power delivery regulation to the load.

BRIEF DESCRIPTION OF THE DRAWINGS

A more complete understanding of the present disclosure may be acquired by referring to the following description taken in conjunction with the accompanying drawings wherein.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to the teachings of this disclosure, an integrated Class D peripheral may be incorporated with a microcontroller for use in many different applications. Use of a simple triangle waveform (saw tooth) oscillator normally used for detecting changes in capacitance values in combination with a voltage comparator provides inexpensive generation of pulse width modulation (PWM) suitable for a wide range of Class D power applications.

Referring now to the drawings, the details of specific example embodiments are schematically illustrated. Like elements in the drawings will be represented by like numbers, and similar elements will be represented by like numbers with a different lower case letter suffix.

Figure 1:
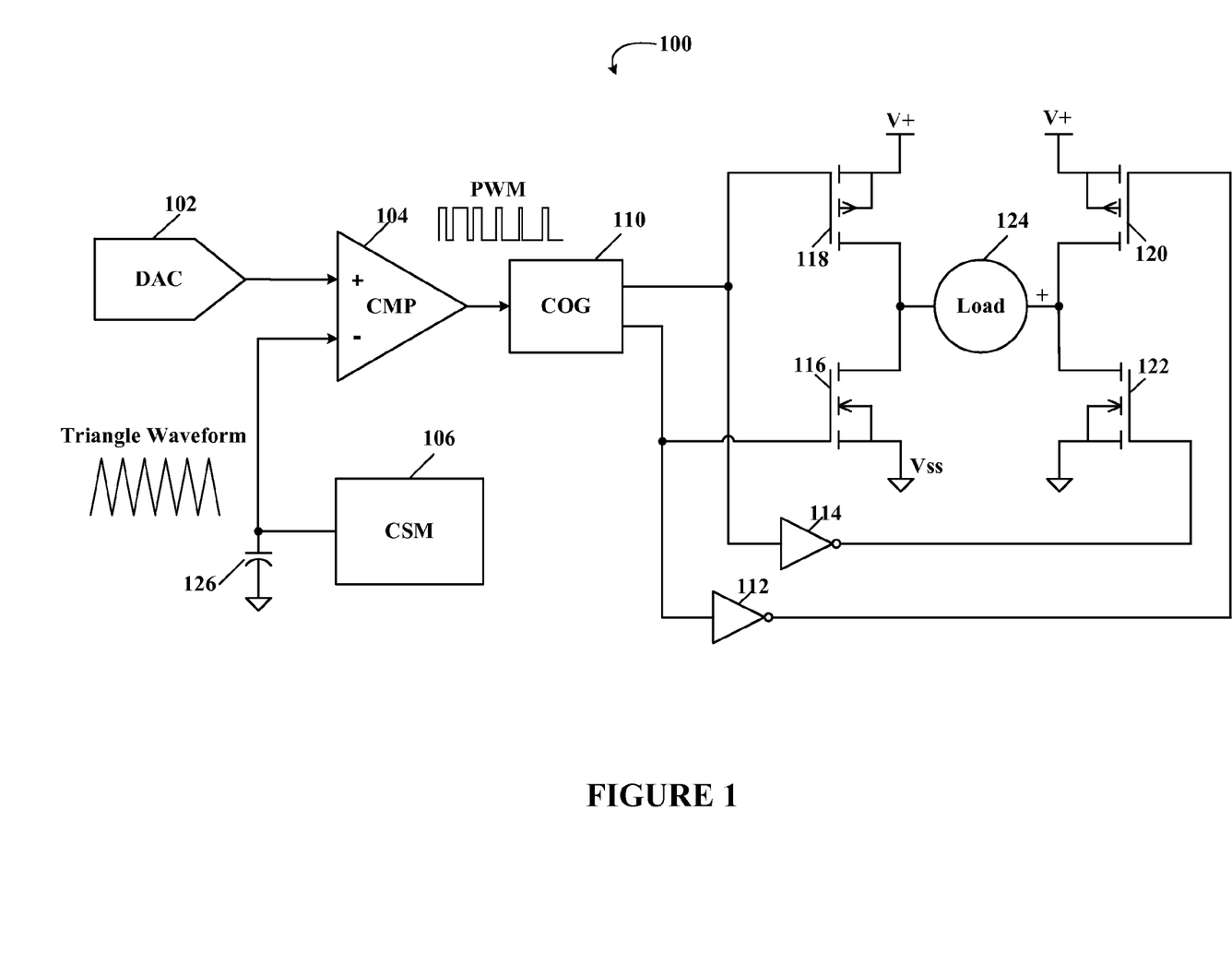
FIG. 1 illustrates a schematic block diagram of a circuit for an open loop Class D power driver peripheral utilizing a DAC as a signal source, according a specific example embodiment of this disclosure.

Referring to FIG. 1, depicted is a schematic block diagram of a circuit for an open loop Class D power driver peripheral utilizing a DAC as a signal source, according a specific example embodiment of this disclosure. The open loop Class D power driver peripheral, generally represented by the numeral 100, may comprise a digital-to-analog converter (DAC) 102, a voltage comparator 104, a complementary output generator (COG) 110, a capacitive sensing module (CSM) 106, a timing capacitor 126, inverters 112 and 114, and power metal oxide semiconductor field effect transistors (MOSFETs) 116-122 driving a load 124. The DAC 102 may have its digital inputs coupled to a microcontroller (not shown) and provide analog control of the pulse width modulation (PWM) duty cycle to the COG 110.

The COG 110 is a peripheral having a single ended input and two complementary outputs (or four to eliminate the inverters 112 and 114). The purpose of the COG 110 is to provide two (or four) outputs and provide dead bands between assertions of the outputs so that there is no "current shoot through" of transistor pairs 116, 118 and 120, 122, e.g., only one of the pairs may be on at a time by using "dead band control of the PWM waveforms to the power MOSFETs 116-122.

The CSM 106 and timing capacitor 126 may be used to generate a triangle waveform that is coupled to an input of the comparator 104. By using the comparator 104 with a triangle waveform on one input and an analog voltage on the other input, a pulse width modulation (PWM) waveform may be generated. Wherein the duty cycle of the PWM waveform is dependent upon the analog voltage value from the DAC 102, and the frequency of the PWM waveform is dependent upon the frequency of the triangle wave from the CSM 106. The CSM 106 is designed to generate an oscillation at a frequency determined by the capacitance value of the capacitor 126. Normally the CSM 106 is used with capacitive touch key applications wherein the CSM frequency changes when the capacitance of the touch key changes. The change in frequency is measured and used as an indication of the capacitive key being touched. In the present application the triangle waveform oscillation from the CSM 106 is used as a triangle waveform reference input to the comparator 104. The CSM 106 is a relaxation oscillator having a substantially triangular waveform. For more detailed circuit descriptions and applications for the capacitive sensing module (SCM) see Microchip Application Notes AN1101, AN1171, AN1268 and AN1334 at www.microchip.com, wherein all of which are hereby incorporated by reference herein for all purposes.

Figure 7:
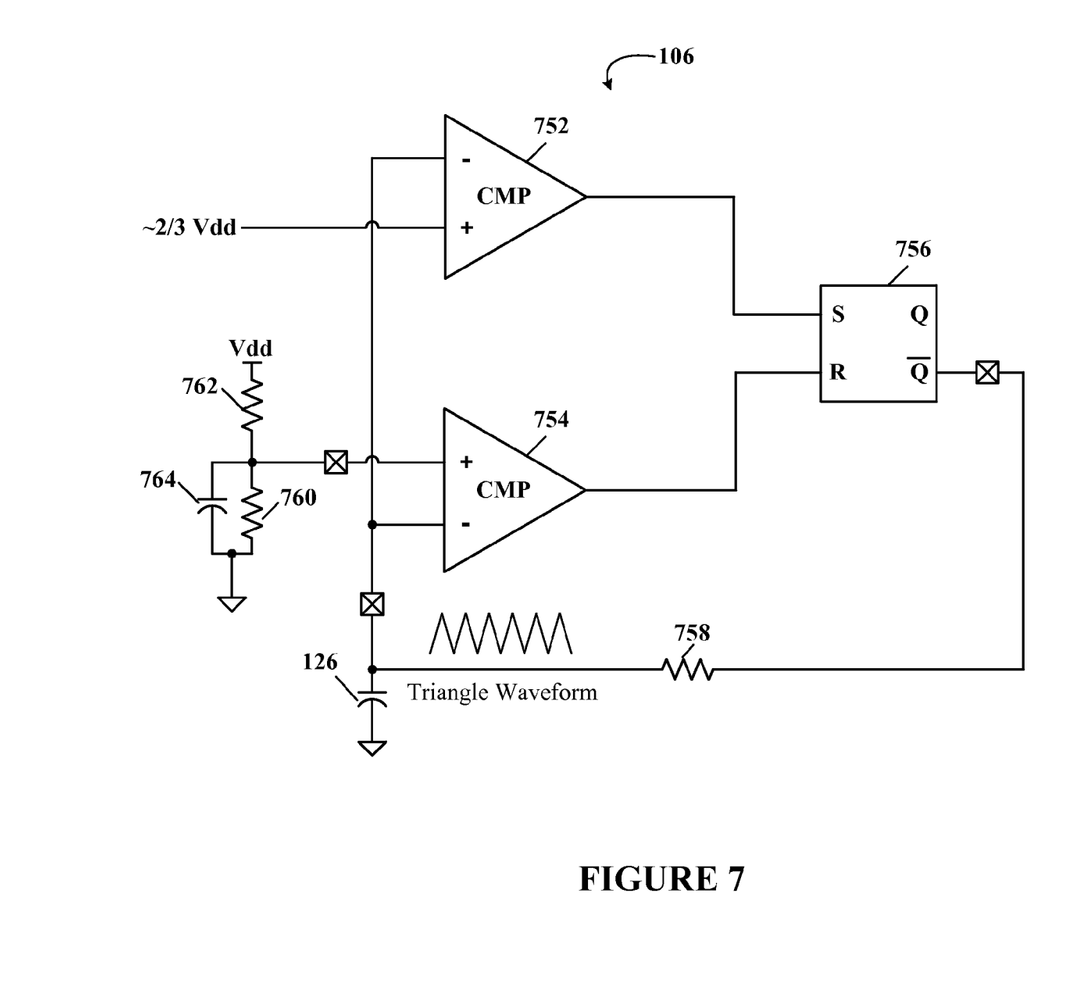
FIG. 7 illustrates a schematic block diagram of a capacitive sensing module, according to specific example embodiments of this disclosure.

Referring to FIG. 7, depicted is a schematic block diagram of a capacitive sensing module, according to specific example embodiments of this disclosure. The capacitive sensing module (CSM) 106 may comprise a free-running RC relaxation oscillator using two comparators 752 and 754, an SR latch 756, resistor 758, and capacitor 126. The SR latch 756 is used to change the voltage charge direction, up or down, of the capacitor 126. It will charge and discharge the capacitor 126 at a rate determined by an RC time constant defined by the feedback resistor 758 and capacitor 126. This up and down charging will be between upper and lower limits set by the positive inputs to the comparators 752 and 754. The time required to charge from the lower limit to the upper limit and discharge back to the lower limit is the period of the oscillator. The positive inputs of the comparators 752 and 754 are the upper and lower charging limits. The reference voltage, e.g., ⅔ Vdd, to the comparator 752 may be supplied internally, and the reference voltage to the comparator 754 may be supplied either externally (e.g., voltage divider resistors 760 and 762) to set the lower limit or from an internal voltage reference. The capacitor 764 may be used to reject high-frequency noise from the power supply and ensure a stable lower limit.

The voltage at the capacitor 126 will charge and discharge between these limits, and may be driven by logic level signals from the /Q output of latch 756. The output from comparator 754 may be configured to get the appropriate charging and discharging behavior. Feedback resistor 758 forms an RC time constant with the capacitor 126. When the voltage on the capacitor 126 is below the lower limit, the /Q output of latch 756 goes high, and the capacitor 126 will begin charging. In between the high and low voltage limits, the latch 756 will retain the last state (charging or discharging). When the voltage on the capacitor 126 is above the upper limit the /Q output of latch 756 goes low, and the capacitor 126 will begin discharging and continue to discharge until reaching the low limit, thus a substantially triangle waveform is generated.

Figure 8:
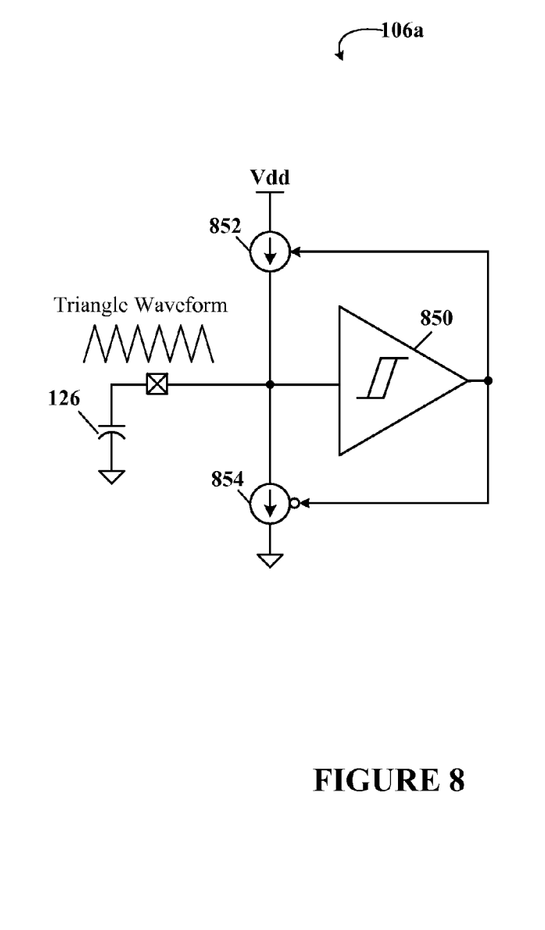
FIG. 8 illustrates a schematic block diagram of another capacitive sensing module, according to specific example embodiments of this disclosure.

Referring to FIG. 8, depicted is a schematic block diagram of another capacitive sensing module, according to specific example embodiments of this disclosure. Another capacitive sensing module (CSM) 106a may comprise a single comparator 850 with hysteresis, and first and second current sources 852 and 854 configured to run as a free running oscillator with the timing capacitor 126 determining the frequency thereof. The single comparator 850 with hysteresis has two voltage limits, a high and a low voltage limit that its input may change between before the output of the comparator 850 changes state. When the output of the comparator 850 is high the charging current source may be enabled, and when the output of the comparator 850 is low the discharging current source may be enabled. Providing current source 852 to charge the timing capacitor 126, and current source 854 to discharge the timing capacitor provides a better shaped triangle waveform. CSM 106 or CSM 106a may be used interchangeably as discussed throughout this disclosure and as shown in FIGS. 1-4 and 6. It is contemplated and within the scope of this disclosure that other circuit designs may be used for the CSM 106 or 106a, and one having ordinary skill in electronic circuit design and the benefit of this disclosure could design such circuits.

Referring back to FIG. 1, the power MOSFETs 116-122 may be configured as a full-bridge H and drive the load 124, e.g., motor, transducer, solenoid and piezo electric actuators, speaker, and the like. A half-bridge may also be used and is contemplated herein. The amount of power supplied to the load 124 through the power MOSFETs 116-122 may be controlled by the analog output voltage of the DAC 102 and may be varied according to the application requirements. For audio speaker driving applications low loss, low pass filters (not shown) may be coupled between the terminals of the load 124 and the junctions of the MOSFET pairs 116, 118 and 120, 122. The DAC 102, comparator 104, CSM 106, COG 110, and inverters 112 and 114 may be provided in a mixed signal (analog and digital) microcontroller, as manufactured by Applicant. For lower power driving applications output drivers (not shown), instead of the MOSFETs 116-122, may also be provided with the microcontroller. The timing capacitor 126 may be external and selected for a desired (triangle waveform) PWM frequency.

Figure 2:
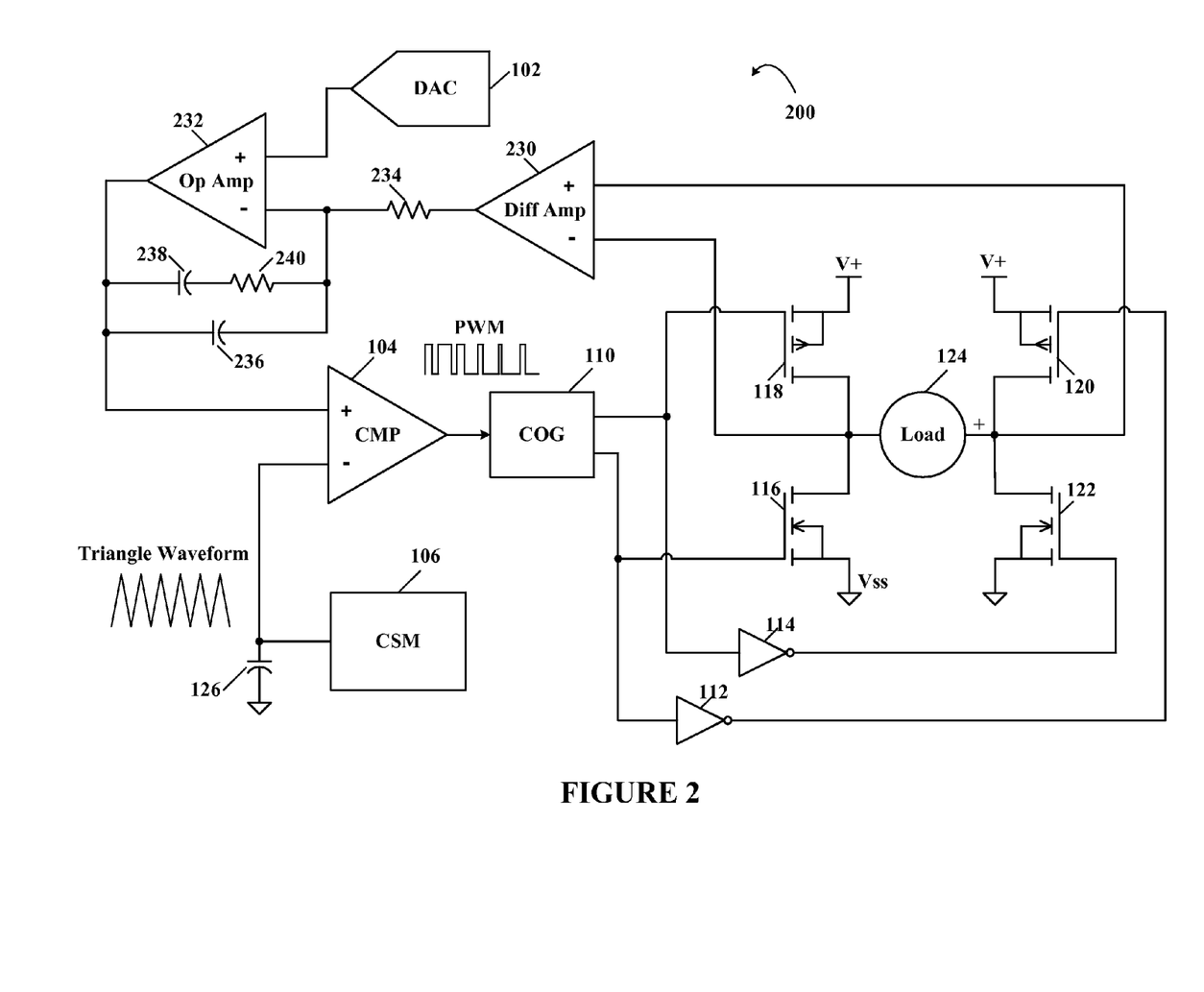
FIG. 2 illustrates a schematic block diagram of a circuit for a closed loop Class D power driver peripheral utilizing a DAC as a signal source, according another specific example embodiment of this disclosure.

Referring to FIG. 2, depicted is a schematic block diagram of a circuit for a closed loop Class D power driver peripheral utilizing a DAC as a signal source, according another specific example embodiment of this disclosure. The closed loop Class D power driver peripheral, generally represented by the numeral 200, may comprise a digital-to-analog converter (DAC) 102, a voltage comparator 104, a complementary output generator (COG) 110, a capacitive sensing module (CSM) 106, a timing capacitor 126, inverters 112 and 114, and power metal oxide semiconductor field effect transistors (MOSFETs) 116-122 driving a load 124. The closed loop Class D power driver peripheral 200 functions substantially the same as described above for the circuit shown in FIG. 1 with the addition of a close loop feedback circuit comprising a differential amplifier 230 having inputs coupled to the terminals of the load 124 and driving an operational amplifier 232 having closed loop compensation components resistor 240, and capacitors 236 and 238. The closed loop compensation components form a compensation network, e.g., they provide feedback to guarantee that the actual drive to the load 124 matches the input signal. Since the output network (load 124) is an LC (inductor and optional capacitor), and the feedback is negative, there is the possibility of instability and oscillation caused by the feedback, so the purpose of the combination of resistor 240 and capacitors 236 and 238 in the compensation network is to provide sufficient gain and phase shift to insure stability and fidelity to the original input signal. Also the gain of the operational amplifier may be determined by resistor 234 in combination with the compensation network (resistor 240 and capacitors 236 and 238). The output to the load 124 may thereby be closed loop compensated and subtracted from the DAC 102 output with the operational amplifier 232.

Figure 3:
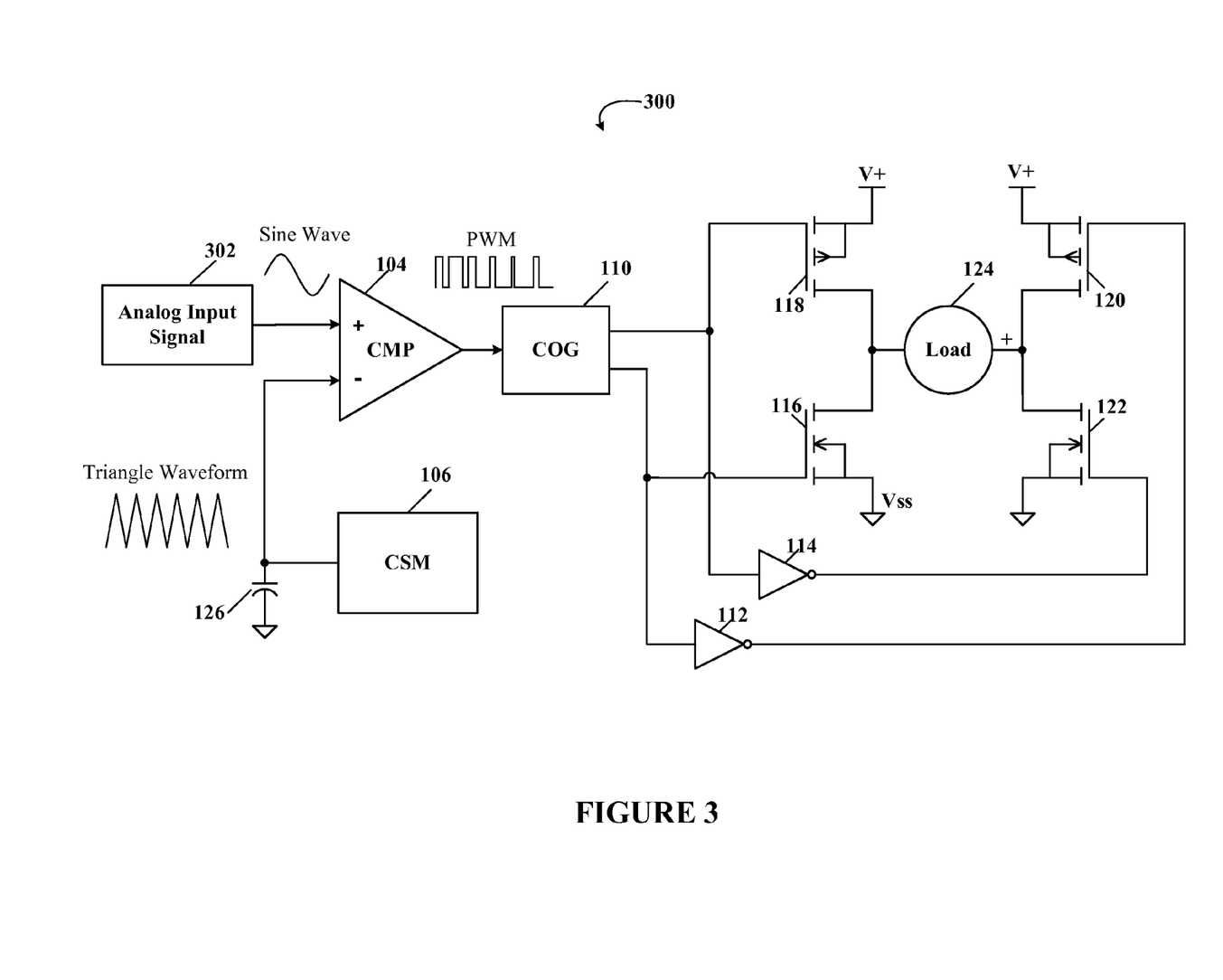
FIG. 3 illustrates a schematic block diagram of a circuit for an open loop Class D audio power driver peripheral utilizing an external signal source, according yet another specific example embodiment of this disclosure.

Referring to FIG. 3, depicted is a schematic block diagram of a circuit for an open loop Class D audio power driver peripheral utilizing an external signal source, according yet another specific example embodiment of this disclosure. In the open loop Class D audio power driver peripheral, generally represented by the numeral 300, the DAC 102 has been replaced by an analog input signal, e.g., audio signal, which may be a time varying analog voltage applied to an input of the comparator 104. A PWM waveform representative of the analog input signal is thereby generated and coupled to the COG 110 for driving the power MOSFETs 116-122.

Figure 4:
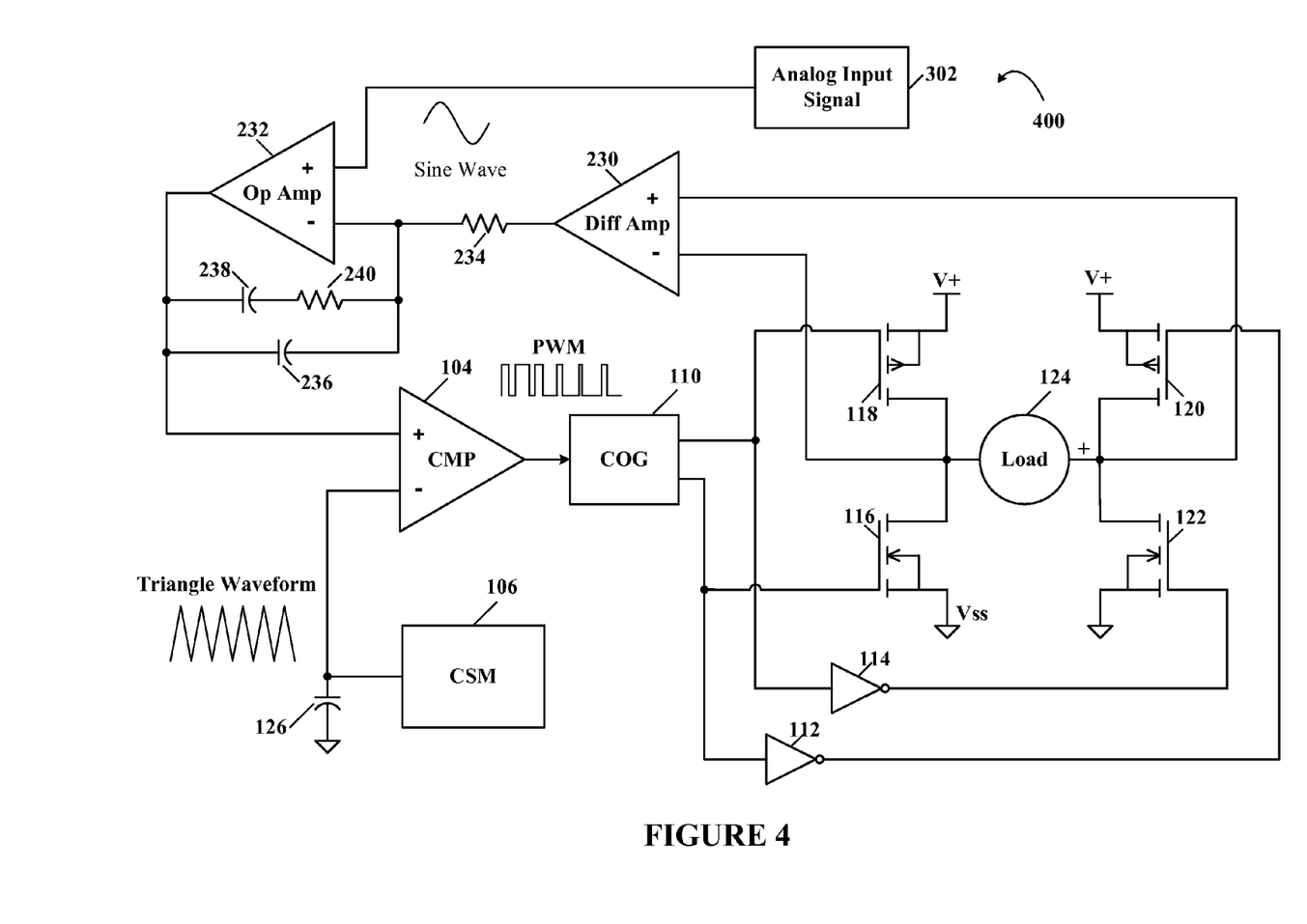
FIG. 4 illustrates a schematic block diagram of a circuit for a closed loop Class D audio power driver peripheral utilizing an external signal source, according still another specific example embodiment of this disclosure.

Referring to FIG. 4, depicted is a schematic block diagram of a circuit for a closed loop Class D audio power driver peripheral utilizing an external signal source, according still another specific example embodiment of this disclosure. In the closed loop Class D audio power driver peripheral, generally represented by the numeral 400, the DAC 102 has been replaced by an analog input signal, e.g., audio signal, which may be a time varying analog voltage applied to an input of the comparator 104. A PWM waveform representative of the analog input signal is thereby generated and coupled to the COG 110 for driving the power MOSFETs 116-122.

The Class D audio power driver peripherals shown in FIGS. 3 and 4 operate in substantially the same way as the Class D power driver peripherals shown in FIGS. 1 and 2, respectively, except that the analog voltage applied to an input of the comparator 104 is time varying and not a constant DC set point from the DAC 102.

Figure 5:
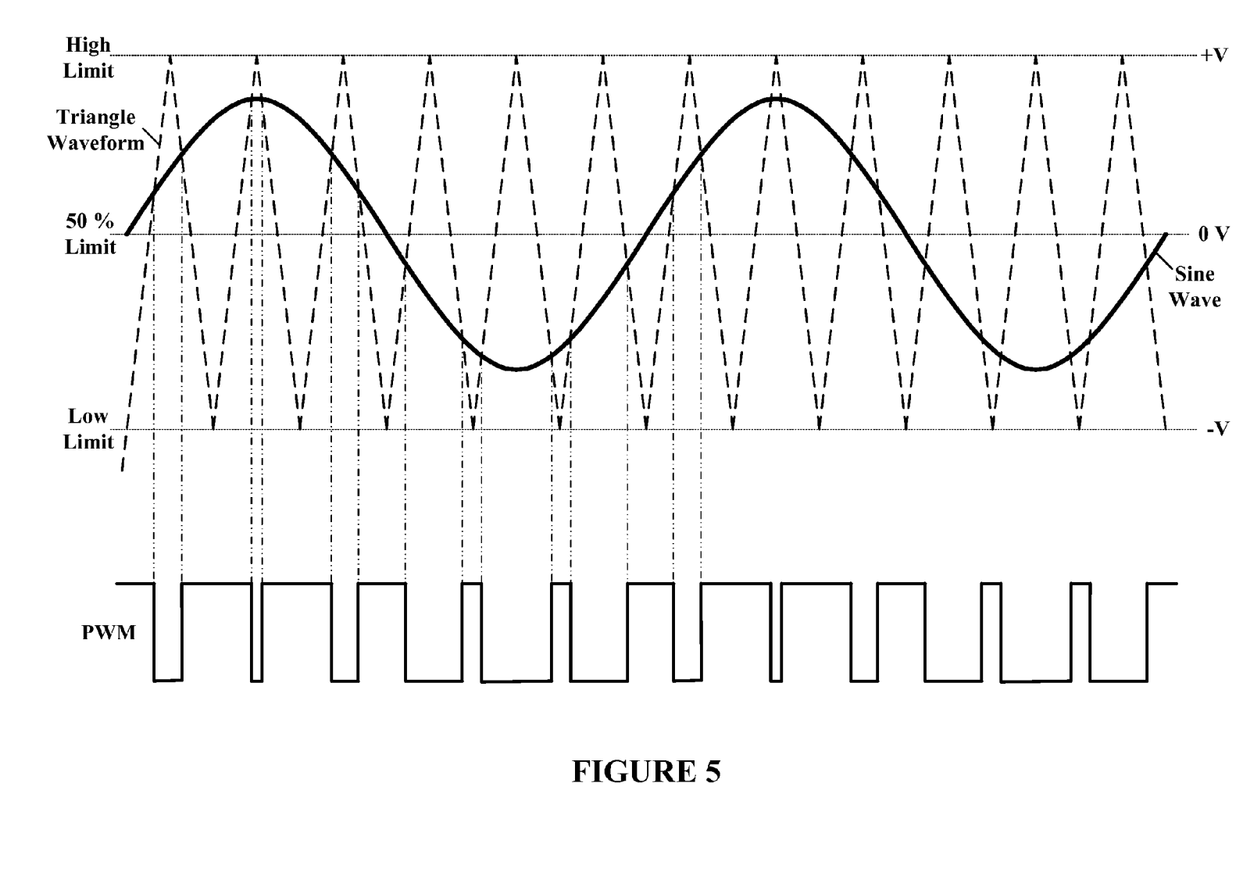
FIG. 5 illustrates schematic graphs showing waveform timing relationships for the circuits shown in FIGS. 3 and 4, according to specific example embodiments of this disclosure.

Referring to FIG. 5, depicted are schematic graphs showing waveform timing relationships of the circuits shown in FIGS. 3 and 4, according to specific example embodiments of this disclosure. In the example shown in FIGS. 3, 4 and 5, the audio input and triangular wave are both centered around 0 volts, so that for an analog audio input at zero (0) volts, the duty ratio of the PWM output pulses is approximately 50 percent. For a large amplitude positive input, it is nearer 100 percent, and for a large amplitude negative input it is nearer zero percent. If the audio amplitude exceeds that of the triangle wave, full modulation occurs (100 percent on or off pulse width), where the pulse train stops switching, and the duty ratio within individual periods is either zero (0) percent or 100 percent.

Figure 6:
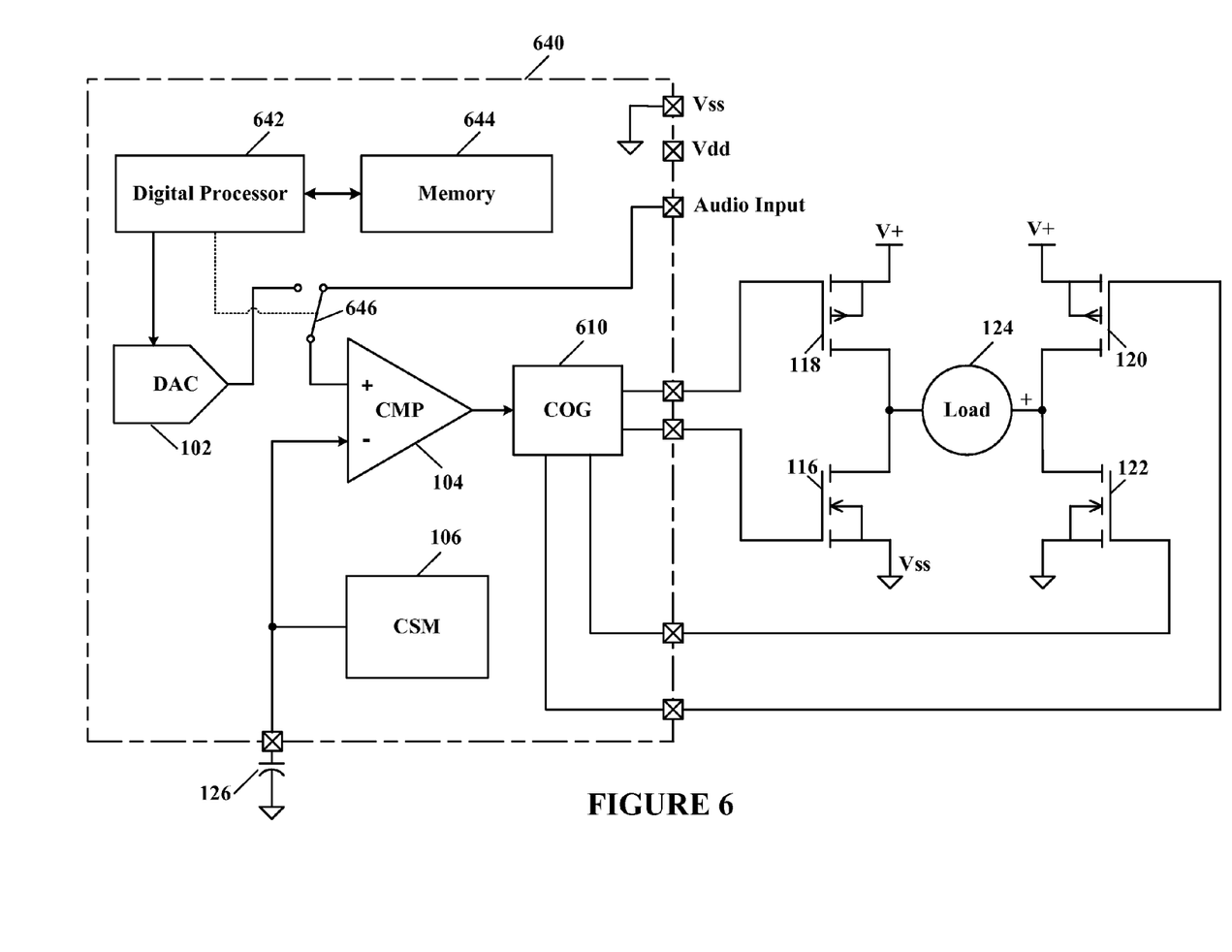
FIG. 6 illustrates a schematic block diagram of an integrated circuit microcontroller comprising a Class D power driver peripheral utilizing a DAC as a signal source, according to specific example embodiments of this disclosure.

Referring to FIG. 6, depicted is a schematic block diagram of an integrated circuit microcontroller comprising a Class D power driver peripheral utilizing a DAC as a signal source, according to specific example embodiments of this disclosure. An integrated circuit (IC) microcontroller 640 comprising a digital processor 642 and memory 644, and the Class D power driver peripherals shown in FIGS. 1-4 may be used as a cost effective solution for many Class D power applications. An internal configuration switch 646 (solid state) may also be included in the microcontroller 640 for increased versatility by allowing the microcontroller 640 to be used for either Class D audio or Class D control applications, e.g., motors and actuators. The COG 610 may have four outputs that eliminate the requirement for the two inverters 112 and 114, but otherwise operates substantially the same as the COG 110 described more fully hereinabove. For lower power Class D applications the power MOSFETs 116-122 may be replaced by output drivers (not shown) that may be included in the microcontroller 640 die/package.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A class D power driver peripheral, comprising:
   a voltage comparator;
   a differential amplifier having first and second inputs adapted for coupling to a load;
   an operational amplifier having a first input coupled to an output of the differential amplifier and a second input coupled to an analog voltage, wherein an output of the operational amplifier is coupled to a first input of the voltage comparator; and
   a closed loop compensation circuit coupled between the first input and the output of the operational amplifier;
   a capacitive sensing module (CSM) having an output coupled to a second input of the voltage comparator and to an external capacitor, wherein the CSM provides a triangle waveform output to the voltage comparator and the external capacitor determines a frequency of the triangle waveform; and
   a complementary output generator (COG) having an input coupled to an output of the voltage comparator and a plurality of outputs controlled by the output of the voltage comparator and configured to drive a driver stage coupled with the load.

2. The class D power driver peripheral according to claim 1, wherein the analog voltage is provided by a digital-to-analog converter (DAC).

3. The class D power driver peripheral according to claim 2, wherein the voltage comparator, the CSM, the DAC and the COG are provided in an integrated circuit microcontroller, and the DAC is coupled to and controlled by a digital processor of the microcontroller.

4. A system comprising the class D power driver according to claim 2, and further comprising:
   a plurality of power metal oxide semiconductor field effect transistors (MOSFETs) each having a gate control coupled to a respective one of the COG outputs, wherein the plurality of power MOSFETs are configured in an H-bridge; and
   a load coupled to and power by the H-bridge configured power MOSFETs.

5. The system according to claim 4, further comprising:
   a differential amplifier having first and second inputs coupled to the load;
   an operational amplifier having a first input coupled to an output of the differential amplifier and a second input coupled to the analog voltage, wherein an output of the operational amplifier is coupled to the first input of the voltage comparator instead of the analog voltage; and a closed loop compensation circuit coupled with the operational amplifier.

6. The class D power driver peripheral according to claim 1, wherein the analog voltage is provided by an external audio signal.

7. The class D power driver peripheral according to claim 6, wherein the voltage comparator, the CSM, the COG, the differential amplifier, the operational amplifier and the closed loop compensation circuit are provided in an integrated circuit microcontroller.

8. The class D power driver peripheral according to claim 1, wherein the voltage comparator, the CSM and the COG are provided in an integrated circuit microcontroller.

9. The class D power driver peripheral according to claim 1, wherein the CSM comprises:

first and second CSM comparators;

an RS-latch, wherein the set input of the RF-latch is coupled to an output of the first CSM comparator and the reset input is coupled to the second CSM comparator; and a feedback resistor coupled between a Q-not output of the RS-latch and the external capacitor, wherein the CSM operates as a relaxation oscillator generating a triangle waveform having a frequency that is determined by the external capacitor.

10. The class D power driver peripheral according to claim 1, wherein the CSM comprises:

a comparator with hysteresis; and first and second current sources coupled to an input of the comparator with hysteresis and the external capacitor, wherein an output of the comparator with hysteresis controls operation of the first and second current sources for charging and discharging the external capacitor, wherein the CSM operates as a relaxation oscillator generating a triangle waveform having a frequency that is determined by the external capacitor.

11. A system comprising the class D power driver according to claim 1, and further comprising:

a plurality of power metal oxide semiconductor field effect transistors (MOSFETs) each having a gate control coupled to a respective one of the COG outputs, wherein the plurality of power MOSFETs are configured in an H-bridge; and a load coupled to and power by the H-bridge configured power MOSFETs.

12. The system according to claim 11, wherein the load comprises an audio speaker.

13. The system according to claim 11, wherein the load is selected from the group consisting of a motor, a transducer, a solenoid actuator, and a piezo electric actuator.

14. The system according to claim 11, wherein the COG has dead band control to prevent current shoot through of the H-bridge configured power MOSFETs.

15. The system according to claim 11, further comprising:

a differential amplifier having first and second inputs coupled to the load;

an operational amplifier having a first input coupled to an output of the differential amplifier and a second input coupled to the analog voltage, wherein an output of the operational amplifier is coupled to the first input of the voltage comparator instead of the analog voltage; and a closed loop compensation circuit coupled with the operational amplifier.

16. An integrated circuit microcontroller having a class D power driver peripheral, comprising:

a digital processor and memory;

a digital-to-analog converter (DAC) having inputs coupled to the digital processor;

a voltage comparator having a first input coupled to an output of the DAC;

a capacitive sensing module (CSM) having an output coupled to a second input of the voltage comparator and in input coupled to an external capacitor, wherein the CSM provides a triangle waveform output to the voltage comparator and the external capacitor determines a frequency of the triangle waveform;

a complementary output generator (COG) having an input coupled to an output of the voltage comparator and a plurality of outputs controlled by the output of the voltage comparator;

a differential amplifier having first and second inputs adapted for coupling to a load driven by the COG;

an operational amplifier having a first input coupled to an output of the differential amplifier and a second input coupled to the analog voltage, wherein an output of the operational amplifier is coupled to the first input of the voltage comparator instead of the analog voltage; and a closed loop compensation circuit coupled with the operational amplifier.

17. The integrated circuit microcontroller according to claim 16, further comprising a switch coupled between the output of the DAC and the first input of the voltage comparator, and also coupled to an external analog input, wherein the switch is controlled by the digital processor and is adapted to couple either the output of the DAC or the external analog input to the first input of the voltage comparator.

18. The integrated circuit microcontroller according to claim 16, wherein the CSM comprises:

first and second CSM comparators;

an RS-latch, wherein the set input of the RF-latch is coupled to an output of the first CSM comparator and the reset input is coupled to the second CSM comparator; and a feedback resistor coupled between a Q-not output of the RS-latch and the external capacitor.

19. The integrated circuit microcontroller according to claim 16, wherein the CSM comprises:

a comparator with hysteresis; and first and second current sources coupled to an input of the comparator with hysteresis and the external capacitor, wherein an output of the comparator with hysteresis controls operation of the first and second current sources for charging and discharging the external capacitor.

20. A method for providing a class D power driver peripheral said method comprising the steps of:

comparing within a microcontroller an analog voltage to a triangle waveform with a voltage comparator, wherein the triangle waveform is provided from a capacitive sensing module (CSM) within the microcontroller;

feeding a pulse width modulation (PWM) waveform resulting from the comparison of the analog voltage and the triangle waveform to a complementary output generator (COG) within the microcontroller;

generating PWM signals with the COG within the microcontroller to control an H-bridge connected plurality of power metal oxide semiconductor field effect transistors (MOSFETs);

coupling a differential amplifier within the microcontroller to the load;

coupling an operational amplifier within the microcontroller to the differential amplifier and the analog voltage; and coupling the operational amplifier to the CSM, wherein the differential amplifier and operational amplifier provide feedback from the load for improved power delivery regulation to the load.

21. The method according to claim 20, further comprising the step of powering a load with the H-bridge connected plurality of power MOSFETs.

* * * * *